US011276770B2

(12) United States Patent
Yang et al.

(10) Patent No.: US 11,276,770 B2
(45) Date of Patent: Mar. 15, 2022

(54) GATE CONTROLLED LATERAL BIPOLAR JUNCTION/HETEROJUNCTION TRANSISTORS

(71) Applicant: GLOBALFOUNDRIES U.S. INC., Santa Clara, CA (US)

(72) Inventors: Mankyu Yang, Fishkill, NY (US); Jagar Singh, Clifton Park, NY (US); Alexander Martin, Greenfield Center, NY (US); John J. Ellis-Monaghan, Grand Isle, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 167 days.

(21) Appl. No.: 16/674,432

(22) Filed: Nov. 5, 2019

(65) Prior Publication Data

US 2021/0134987 A1    May 6, 2021

(51) Int. Cl.
*H01L 29/735* (2006.01)
*H01L 29/737* (2006.01)
*H01L 29/06* (2006.01)
*H01L 29/417* (2006.01)
*H01L 29/10* (2006.01)

(52) U.S. Cl.
CPC ........ *H01L 29/735* (2013.01); *H01L 29/0657* (2013.01); *H01L 29/0692* (2013.01); *H01L 29/1008* (2013.01); *H01L 29/41708* (2013.01); *H01L 29/737* (2013.01)

(58) Field of Classification Search
None
See application file for complete search history.

(56) References Cited

U.S. PATENT DOCUMENTS

| 4,987,468 A | 1/1991 | Thornton |
| 5,705,839 A | 1/1998 | Hsu et al. |
| 5,717,241 A | 2/1998 | Malhi et al. |
| 7,173,320 B1 * | 2/2007 | Rahim ............... H01L 29/0696 257/423 |
| 9,761,664 B1 * | 9/2017 | Gao .................... H01L 29/0649 |

(Continued)

FOREIGN PATENT DOCUMENTS

EP    0137992    4/1985

OTHER PUBLICATIONS

Hashemi et al., "Demonstration of Symmetric Lateral NPN Transistors on SOI Featuring Epitaxially Grown Emitter/Collector Regions," Journal of Electron Device Society, vol. 6, 2018, 6 pages.

(Continued)

*Primary Examiner* — Andres Munoz
(74) *Attorney, Agent, or Firm* — David Cain; Andrew M. Calderon; Roberts Calderon Safran & Cole, P.C.

(57)    ABSTRACT

The present disclosure relates to semiconductor structures and, more particularly, to gate controlled transistors and methods of manufacture. The structure includes: an emitter region; a collector region; base regions on opposing sides of the emitter region and the collector region; and a gate structure composed of a body region and leg regions, the body region being located between the base regions on opposing sides of the emitter region and the collector region, and the leg regions isolating the base regions from both the emitter region and the collector region.

19 Claims, 5 Drawing Sheets

(56) References Cited

U.S. PATENT DOCUMENTS

| | | | |
|---|---|---|---|
| 9,905,668 B2 | 2/2018 | Singh | |
| 2007/0105301 A1* | 5/2007 | Chen | H01L 29/0692 |
| | | | 438/234 |
| 2008/0179663 A1 | 7/2008 | Terashima | |
| 2008/0224266 A1* | 9/2008 | Chang | H01L 29/7393 |
| | | | 257/579 |
| 2010/0213575 A1* | 8/2010 | Chen | H01L 27/0821 |
| | | | 257/575 |
| 2010/0219504 A1* | 9/2010 | Chen | H01L 27/1203 |
| | | | 257/593 |
| 2015/0097265 A1* | 4/2015 | Lin | H01L 21/76224 |
| | | | 257/526 |
| 2015/0287642 A1* | 10/2015 | Chang | H01L 27/0623 |
| | | | 438/236 |

OTHER PUBLICATIONS

Loan et al., "Lateral Bipolar Transistor on Partial SOI: a 2D Simulation Study", ResearchGate, Conference Paper, May 2011, 5 pages.

Specification and Drawings for U.S. Appl. No. 16/430,843, titled "Method for Forming Lateral Heterojunction Bipolar Devices and the Resulting Devices", filed Jun. 4, 2019, 27 pages.

Taiwanese Office Action in related TW Application No. 109134448 dated Jun. 15, 2021, 5 pages.

Taiwanese Office Action in related TW Application No. 109134448 dated Sep. 11, 2021, 11 pages.

* cited by examiner

GATE CONTROLLED LATERAL BIPOLAR JUNCTION/HETEROJUNCTION TRANSISTORS

FIELD OF THE INVENTION

The present disclosure relates to semiconductor structures and, more particularly, to gate controlled transistors and methods of manufacture.

BACKGROUND

A bipolar junction transistor (BJT) is a type of transistor that uses both electrons and holes as charge carriers. A heterojunction bipolar transistor (HBT) is an improvement of the BJT that can handle signals of very high frequencies up to several hundred GHz. BJTs and HBTs can be used as amplifiers or switches, in integrated semiconductor devices providing them applicability in many types of electronic equipment such as mobile devices, audio amplifiers, industrial control, radio transmitters, etc.

BJTs and HBTs have three differently doped semiconductor regions: the emitter region, the base region and the collector region. These regions are, respectively, p type, n type and p type in a PNP transistor, and n type, p type and n type in a NPN transistor. For a HBT, different semiconductor elements are used for the transistor. For example, the emitter can be composed of a larger bandgap material than the base.

In any configuration, though, the base is located between the emitter and the collector. The base is lightly doped material; whereas, the collector and emitter are highly doped, as examples. Due to the proximity between the base and the collector and emitter, leakage current is known to occur between the base to collector or the base to emitter at each side base.

SUMMARY

In an aspect of the disclosure, a structure comprises: an emitter region; a collector region; base regions on opposing sides of the emitter region and the collector region; and a gate structure composed of a body region and leg regions, the body region being located between the base regions on opposing sides of the emitter region and the collector region, and the leg regions isolating the base regions from both the emitter region and the collector region.

In an aspect of the disclosure, a structure comprising: a semiconductor material having an emitter region; a collector region; ant at least one base region; and a segmented gate structure comprising isolation regions positioned between the at least one base region and both the emitter region and the collector region.

In an aspect of the disclosure, a structure comprises: a transistor formed on semiconductor on insulator (SOI) technology and composed of: an emitter region, a collector region, extrinsic base regions on opposing sides of the emitter region and the collector region; and an active body portion of a gate structure composed of polysilicon material and extending between the extrinsic base regions; and isolation regions extending from the active body portion of the gate structure, the isolation regions positioned to isolate the extrinsic base regions from both the emitter region and the collector region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
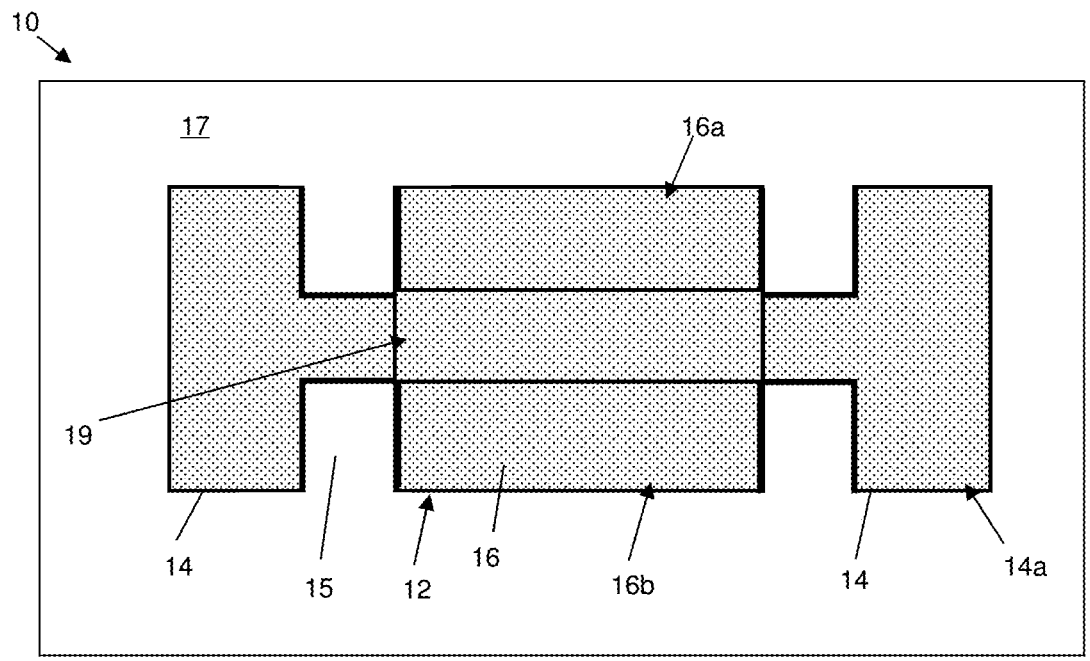
FIG. 1A shows a top view of patterned diffusion regions, amongst other features, and respective fabrication processes in accordance with aspects of the present disclosure.

The present disclosure relates to semiconductor structures and, more particularly, to gate controlled transistors and methods of manufacture. In embodiments, the gate controlled transistors are gate controlled lateral bipolar junction/heterojunction transistors. More specifically, the present disclosure relates to a "H" body gate controlled lateral bipolar junction transistor (LBJT) with double bases using fully depleted SOI (FDSOI) technology. In further embodiments, the present disclosure relates to a "H" body gate controlled lateral heterojunction bipolar junction transistor (LHBT) with double bases using semiconductor on insulator (SOI) technology. Advantageously, both the LBJT and LHBT described herein will reduce leakage current between junctions (base region and emitter/collector regions) to lower power consumption in stand-by mode, amongst other advantages.

The LBJT and LHBT described herein provide excellent bipolar performance in FDSOI technology and SOI technology, respectively. For example, both the LBJT on FDSOI technology and the LHBT on SOI technology provide improved leakage prevention (e.g., reduces leakage) between base to collector or base to emitter by controlling gate biasing between junctions using a unique segmented H body gate design. The LBJT on FDSOI technology and the LHBT on SOI technology further improve base resistance with the segmented H body gate design. The LBJT on FDSOI technology and LHBT on SOI technology can also include an additional epitaxial growth on the base junction to improve base resistance. Moreover, in further embodiments, both the LBJT on FDSOI technology and LHBT on SOI technology benefit from lower parasitic capacitances and demonstrate excellent bipolar performance for $\beta$, gm, and Ic. The LHBT on SOI technology further improves fT and fMax.

Both the LBJT and LHBT are applicable for high frequency electronic circuits and system on chip (SoC). It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The transistors (e.g., LBJT and LHBT) of the present disclosure can be manufactured in a number of ways using a number of different tools. In general, though, the methodologies and tools are used to form structures with dimensions in the micrometer and nanometer scale. The methodologies, i.e., technologies, employed to manufacture the transistors of the present disclosure have been adopted from integrated circuit (IC) technology. For example, the structures are built on wafers and are realized in films of material patterned by photolithographic processes on the top of a wafer. In particular, the fabrication of the transistors uses three basic building blocks: (i) deposition of thin films of material on a substrate, (ii) applying a patterned mask on top of the films by photolithographic imaging, and (iii) etching the films selectively to the mask.

Figure 1B:
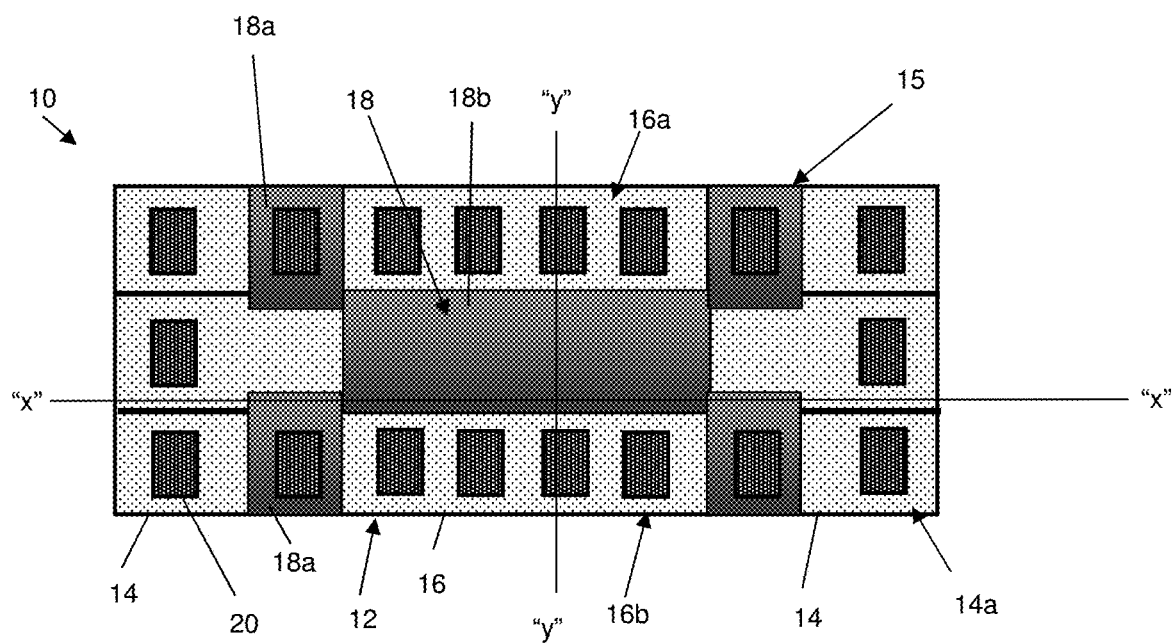
FIG. 1B shows a top view of a transistor on the pattern diffusion regions and respective fabrication processes in accordance with aspects of the present disclosure.

FIG. 1A shows a top view of patterned diffusion prior to gate (e.g., transistor) formation; whereas, FIG. 1B shows a top view of a transistor formed on the patterned diffusion regions after gate formation. Referring both to FIGS. 1A and 1B, the structure 10 is a LBJT on FDSOI technology, which includes a semiconductor material 12 and insulator layer 17 in the FDSOI technology. The semiconductor material 12 can be any suitable fully depleted semiconductor material including, but not limited to, Si, SiGe, SiGeC, SiC, GaAs, InAs, InP, and other III/V or II/VI compound semiconductors.

The insulator layer 17 is provided between the semiconductor layer 12 and a wafer material (not shown). The insulator layer 17 comprises any suitable material including silicon oxide, sapphire, other suitable insulating materials, and/or combinations thereof. An exemplary insulator layer 17 may be a buried oxide layer (BOX). The insulator layer 17 is formed on the wafer by any suitable process, e.g., separation by implantation of oxygen (SIMOX), oxidation, deposition, and/or other suitable processes.

Still referring to FIGS. 1A and 1B, the semiconductor material 12 includes patterned diffusion regions 14, 16. More specifically, the patterned diffusion regions comprise P+ regions 14 and N+ region 16. In embodiments, the diffusions 14, 16 can be provided by an ion implantation process or an epitaxial doping process (e.g., raised p+ or n+ eSiGe) as is known to those of skill in the art such that no further explanation is required herein for a complete understanding of the disclosure. For example, the p+ diffusions 14 can be boron and the n+ diffusions 16 can be arsenic.

In embodiments, an extrinsic base 14a of the LBJT is provided in the P+ regions 14 (e.g., forming a double base region); whereas, a collector region 16a and an emitter region 16b are provided in the N+ region 16. An intrinsic base 19 is provided between the collector region 16a and an emitter region 16b.

A space or opening 15 is provided between the diffusion regions 14, 16 to isolate the extrinsic base region 14a from the collector region 16a and the extrinsic base region 14a from the emitter region 16b. In embodiments, the opening 15 can be formed by conventional lithography and etching methods known to those of skill in the art. For example, a resist formed over the semiconductor material 12 is exposed to energy (light) to form a pattern (opening). An etching process with a selective chemistry, e.g., reactive ion etching (RIE), will be used to form one or more trenches (i.e., openings) 15 in the semiconductor material 12 through the openings of the resist. The formation of the openings 15 will expose the underlying insulator layer 17. The resist can be removed by a conventional oxygen ashing process or other known stripants.

As further shown in FIG. 1B, a segmented H body gate structure 18 is provided over the diffusion regions 14, 16 and within (and/or over) the opening 15. That is, the segmented H body gate structure 18 is provided on the N+ diffusion region 16, e.g., between the collector region 16a and the emitter region 16b (over the intrinsic base region 19), and extending within the opening 15 between the diffusion regions 14, 16. It should be recognized that the intrinsic base 19 is between the between the collector region 16a and the emitter region 16b, under the gate structure 18.

In embodiments, the segmented H body gate structure 18 includes segmented legs (e.g., isolation regions) 18a and a main body portion 18b (e.g., active gate region), each of which are composed of poly material deposited by a conventional deposition method, e.g., epitaxial growth process, followed by a conventional patterning process (i.e., lithography and etching), as required. In embodiments, the main body portion 18b extends between the double base regions 14a along the length of the collector region 16a and the emitter region 16b. The legs 18a of the segmented H body gate structure 18, on the other hand, are provided within and/or above the openings 15 effectively isolating or separating the different diffusion regions 14, 16.

As should be understood by those of ordinary skill in the art, the segmented H body gate structure 18 and, more particularly, the legs 18a, will effectively isolate or separate the diffusions 14, 16, i.e., isolate the base region 14a from the collector region 16a and the emitter region 16b. Also, in this configuration, by controlling the biasing of the segmented H body gate structure 18, it is now possible to significantly reduce the leakage current between the junctions, e.g., reduce the leakage between the base region 14a and the collector region 16a and between the base region 14a and the emitter region 16b.

As further shown in FIG. 1B, a plurality of contacts 20 are formed in the collector region 16a, emitter region 16b, extrinsic base region 14a and on the body of the segmented H body gate structure 18, i.e., including legs 18a. The contacts 20 on the body of the segmented H body gate structure 18, i.e., legs 18a, can be used to provide bias to the gate structure 18. The contacts 20 can be any appropriate conductive material. For example, the contacts 20 can be tungsten or aluminum formed by conventional deposition methods, followed by a planarization process.

Figure 2:
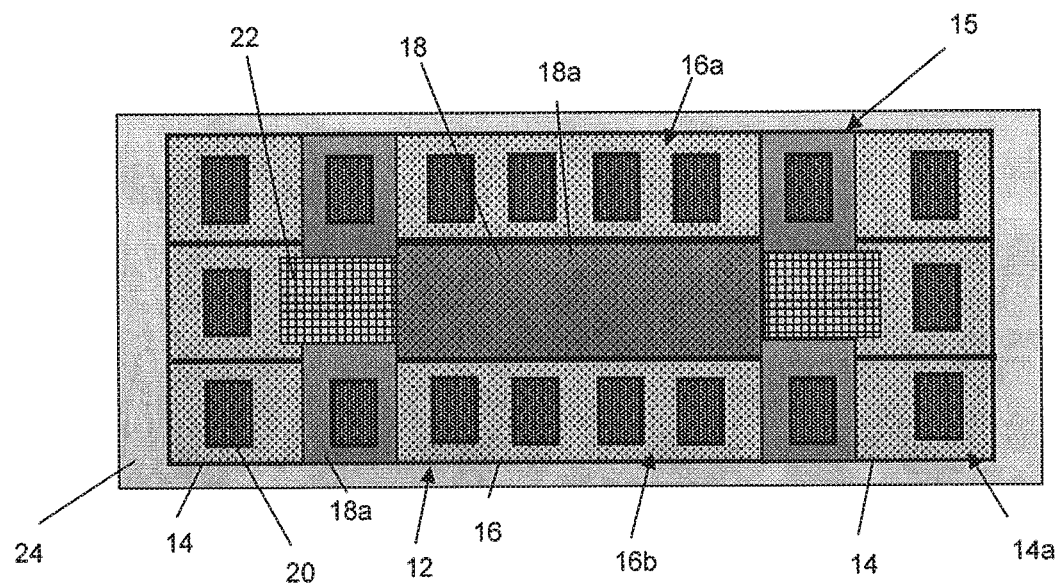
FIG. 2 shows a top view of a transistor and respective fabrication processes in accordance with additional aspects of the present disclosure.

FIG. 2 is representative of fabrication processes in accordance with aspects of the present disclosure. More specifically, FIG. 2 shows a process of fabricating the legs 18a of the segmented H body gate structure 18 and the contacts 20, amongst other features. By way of non-limiting example for the fabrication process of forming the legs 18a, a mask is deposited over portions of the epitaxial material (e.g., to protect portions of the soon to be formed segmented H body gate structure 18), followed by a cutting process (e.g., using a selective etching process) to remove epitaxial material near the base region 14a. In this way, the legs 18a are formed within (and/or over) the openings 15. In embodiments, the legs 18a can overlap onto the semiconductor material 12 of the extrinsic base region 14a. Accordingly, the segmented H body gate structure 18 can be formed over the base region 14, collector region 16a, and emitter region 16b.

As previously noted, the legs 18a are an epitaxial material (e.g., poly) grown on the cut regions (e.g., openings 15) of the base regions 14a. More specifically, the legs 18a are grown over the openings 15, originating from the exposed semiconductor material 12 of the base region 14a, the collector region 16a and the emitter region 16b, which after the cut process, results in a segmented portion (e.g., segmented legs 18a of the gate structure 18). In embodiments, the gate structure 18 over the junction is purposely cut out to improve extrinsic base to intrinsic base junctions. In optional embodiments, after the mask is removed, additional epitaxial material 22 is formed in the extrinsic base region 14a between the legs 18a to improve the base resistance.

Still referring to FIG. 2, the plurality of contacts 20 are formed in the collector region 16a, emitter region 16b and extrinsic base region 14a, including on the segmented H body gate structure 18, i.e., legs 18a. To form the contacts 20, an interlevel dielectric material 24 can be deposited over the structure using a conventional chemical vapor deposition (CVD) process. The interlevel dielectric material 24 can be an oxide based material, as an example. A plurality of trenches are formed in the interlevel dielectric material 24 using conventional lithography and etching processes, exposing the underlying diffusion regions 14, 16 and the poly material of the legs 18a of the segmented H body gate structure 18. A conductive material is deposited within the trenches, followed by a conventional chemical mechanical polishing (CMP) process to remove any excess material on the interlevel dielectric material.

Figure 3:
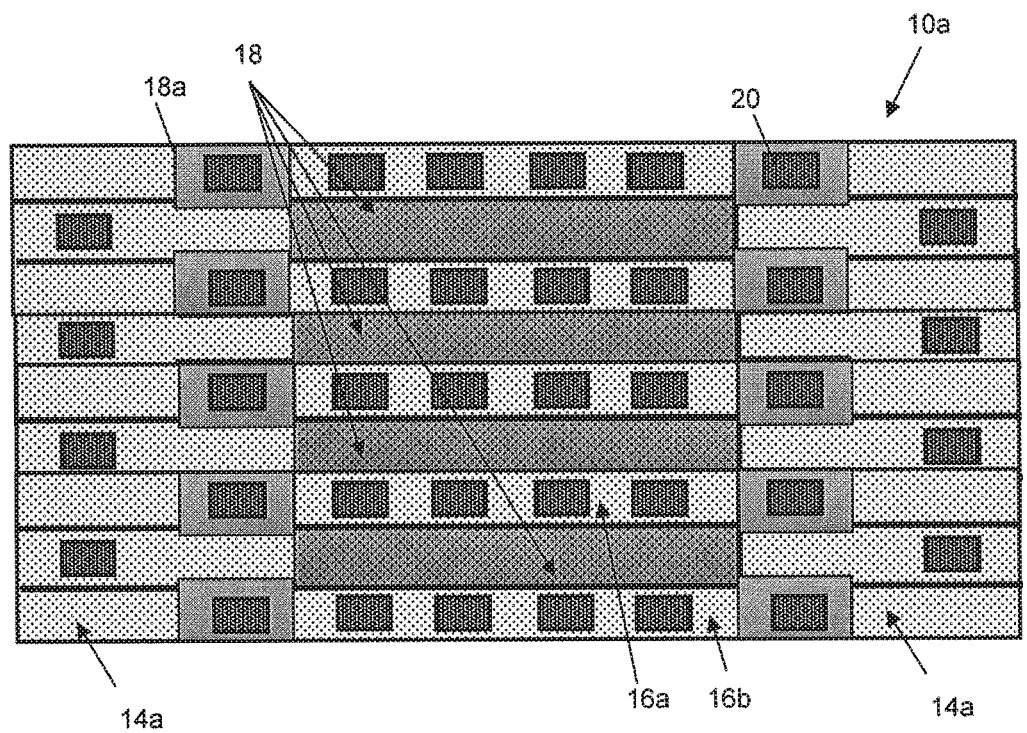
FIG. 3 shows a top view of a multi-fingered transistor in accordance with additional aspects of the present disclosure.

FIG. 3 shows a multi-fingered LBJT 10a in accordance with aspects of the present disclosure. As shown in FIG. 3, the LBJT 10a includes a plurality of segmented H body gate structures 18, each with contacts 20 on their legs 18a. As noted with respect to FIGS. 1A and 1B, the segmented H body gate structures 18 can be back biased to significantly reduce the leakage current between the junctions, e.g., reduce the leakage between the base region 14a and the collector region 16a and between the base region 14a and the emitter region 16b.

Figure 4:
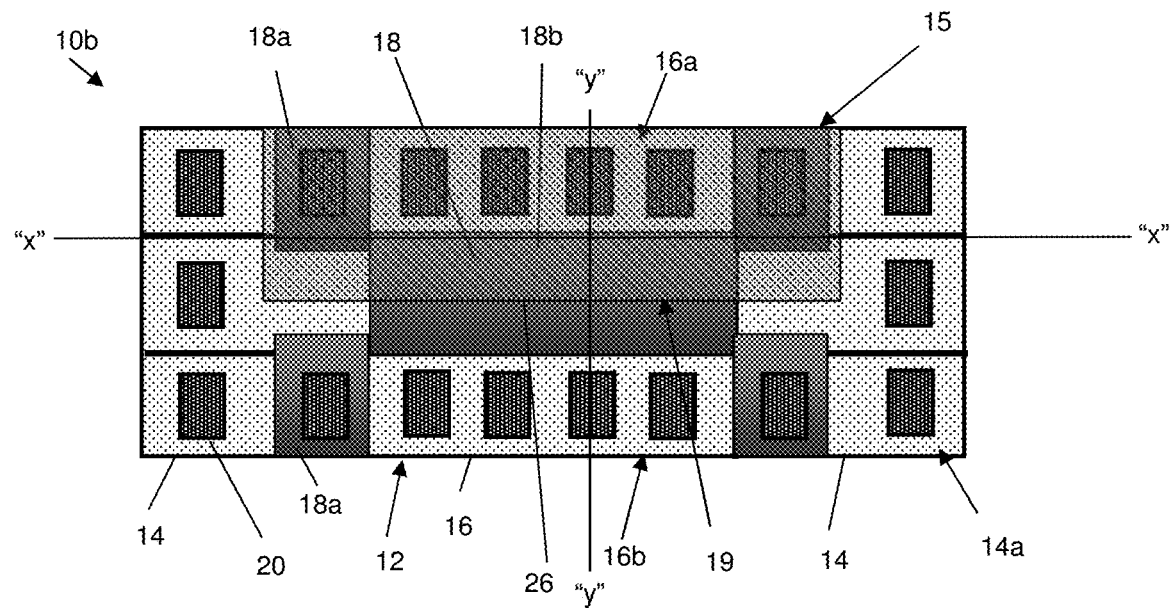
FIG. 4 shows a top view of a transistor in accordance with additional aspects of the present disclosure.

FIG. 4 shows a top view of a transistor in accordance with additional aspects of the present disclosure. In this embodiment, the structure 10b is a LHBT on SOI technology with double bases 14a. In the LBHT 10b, a semiconductor material 26 is deposited over the SOI technology in the collector region 16a and partly over the intrinsic base 19, prior to forming the segmented H body gate structure 18. In alternative embodiments, the semiconductor material 26 is deposited over the emitter region 16b and partly over the intrinsic base 19, prior to forming the segmented H body gate structure 18. In either alternative, the semiconductor material 26 can also extend into the extrinsic base region 14a (over the openings 15).

To form the LBHT 10b, two different semiconductor materials 12, 26 are provided in the channel region of the gate structure 18. For example, as should be understood by those of skill in the art, for an LBHT, the semiconductor material 26 is partly under the gate structure 18 and is a different material than the semiconductor material 12 used to form the collector region 16a, emitter region 16b and base regions (i.e., both intrinsic base region 19 (under the gate structure) and extrinsic base region 14). By way of non-limiting illustration, the semiconductor material 26 which is partly in the channel of the gate structure 18 can be SiGe; whereas, the semiconductor material 12 in remaining portions of the channel of the gate structure can be Si (e.g., SOI technology); although other semiconductor materials are contemplated herein. The semiconductor material 26 can be deposited by a conventional epitaxial grown process directly on the semiconductor material 12.

Still referring to FIG. 4, after the formation of the semiconductor material 26, the segmented H body gate structure 18 and contacts 20 can be fabricated in the manner shown and described with respect to FIGS. 1B and 2. For example, the segmented H body gate structure 18 can be fabricated over the semiconductor material 26 and semiconductor material 12 in a manner similarly described herein. The contacts 20 can be fabricated directly over the semiconductor material 26, in addition to the semiconductor material 12 of the emitter region 16, base region 14a and the body of the segmented H body gate structure 18.

Figure 5:
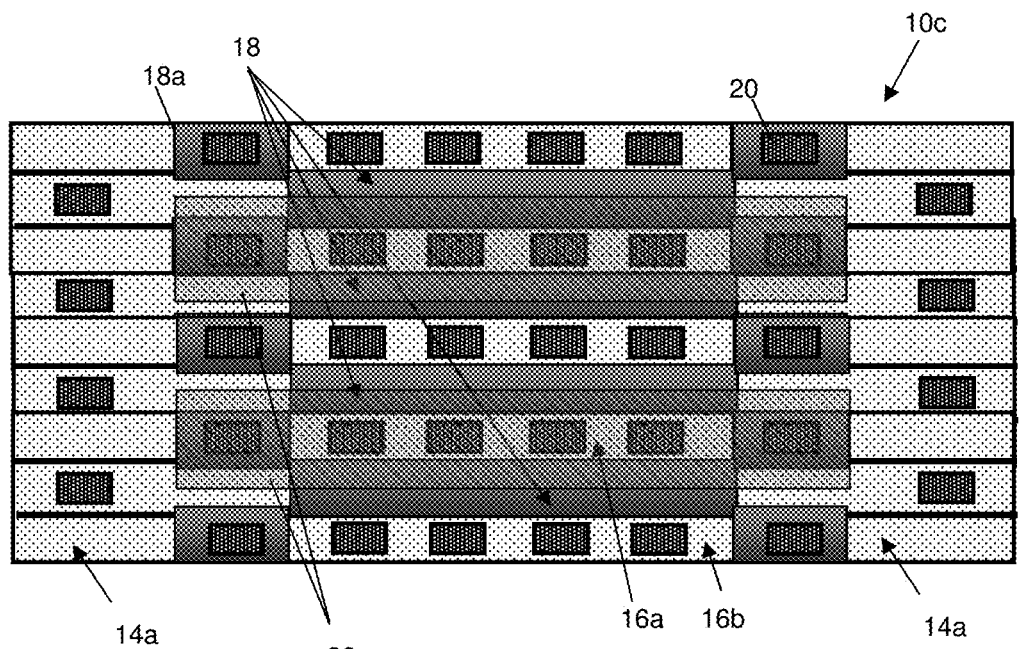
FIG. 5 shows a top view of a multi-fingered transistor in accordance with additional aspects of the present disclosure.

FIG. 5 shows a multi-fingered LHBT 10c in accordance with aspects of the present disclosure. As shown in FIG. 5, the LBHT includes a plurality of segmented H body gate structures 18 with double bases 14a, all of with have contacts 20. As noted with respect to FIG. 4, the semiconductor material 26 is deposited over the collector region 16a and emitter region 16b and partly over the intrinsic base 19 of adjacent segmented H body gate structures 18. That is, the semiconductor material 26 can extend between adjacent devices.

Figure 6A:
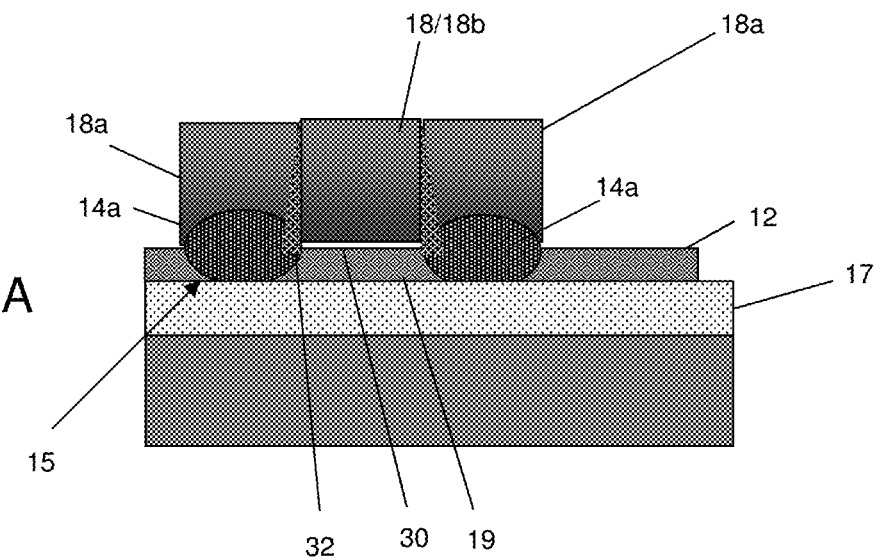
FIGS. 6A and 6B show cross-sectional views of a transistor (i.e., lateral bipolar junction transistor) in accordance with aspects of the present disclosure.
Figure 6B:
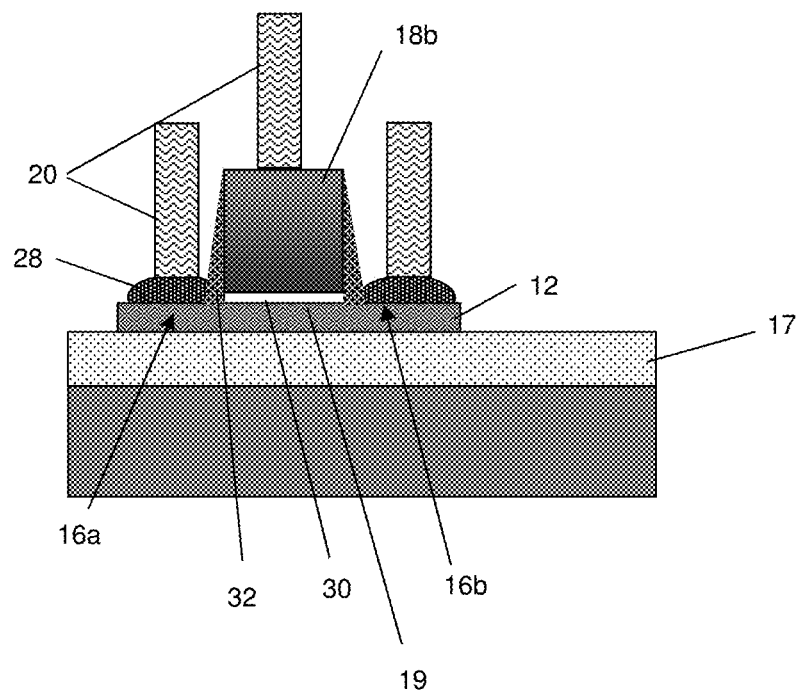

FIGS. 6A and 6B show cross-sectional views of a transistor (i.e., lateral bipolar junction transistor) in accordance with aspects of the present disclosure. In particular, FIG. 6A is a cross-sectional view of the transistor of FIG. 1B along line "y"; whereas, FIG. 6B is a cross-sectional view of the transistor of FIG. 1B along a line "x". Referring to both FIGS. 6A and 6B, the segmented H body gate structures 18 include legs 18a that are provided over the diffusions 14a. In embodiments, the diffusions 14a can be raised semiconductor material, i.e., p+ eSiGe. The active portion 18b of the segmented H body gate structures 18 include a gate dielectric material 30 composed of, e.g., high-k dielectric material. The high-k dielectric material can be, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The segmented H body gate structures 18 can also include sidewall spacers 32, e.g., nitride, formed by a conventional deposition process (e.g., CVD) followed by an anisotropic etching process. The sidewall spacers 32 will isolate the gate structure from the source and drain regions 28 (shown in FIG. 6B).

A silicide can also be provided on the raised source and drain regions 28 and segmented H body gate structures 18, prior to contact formation. As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device.

As further shown in FIG. 6B, in each of the embodiments described herein, the segmented H body gate structures 18 includes raised source and drain regions 28 adjacent to the active portion 18b. In embodiments, the raised source and drain regions 28 can be fabricated by a doped epitaxial process as is known in the art in the collector region 16a and the emitter region 16b.

Figure 7A:
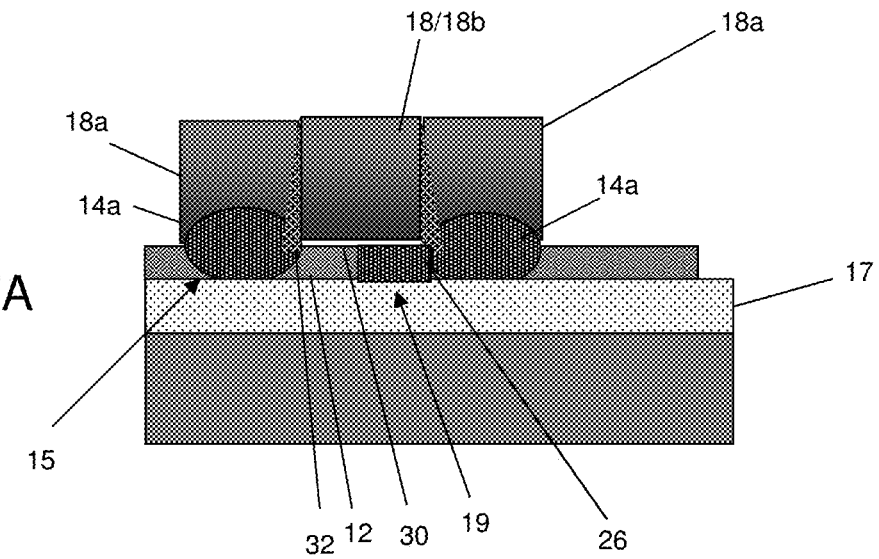
FIGS. 7A and 7B show cross-sectional views of a transistor (i.e., lateral heterojunction bipolar transistor) in accordance with aspects of the present disclosure.
Figure 7B:
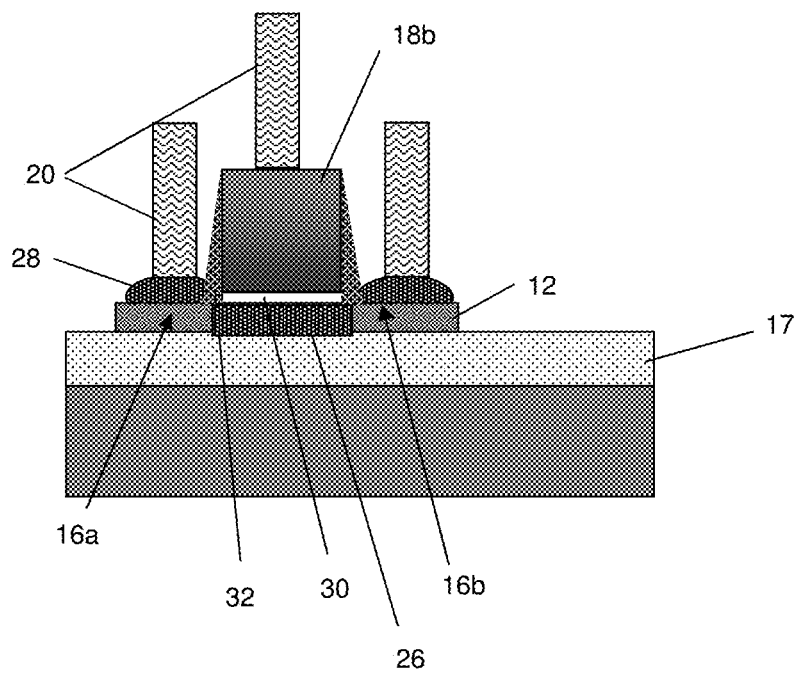

FIGS. 7A and 7B show a cross-sectional view of a transistor (i.e., lateral heterojunction bipolar transistor) in accordance with aspects of the present disclosure. In particular, FIG. 7A is a cross-sectional view of the transistor of FIG. 4 along line "y"; whereas, FIG. 7B is a cross-sectional view of the transistor of FIG. 4 along a line "x". Referring to FIG. 7A, two different semiconductor materials 12, 26 are provided in the channel region of the segmented H body gate structure 18. The semiconductor material 26 can be deposited over the SOI technology in the collector region 16a and partly over the intrinsic base 19 or, alternatively, the semiconductor material 26 is deposited over the emitter region 16b and partly over the intrinsic base 19. In either alternative, the semiconductor material 26 can also extend into the extrinsic base region 14a (over the openings 15).

Referring to both FIGS. 7A and 7B, the segmented H body gate structures 18 include legs 18a that are provided over the diffusions 14a. In embodiments, the diffusions 14a can be raised semiconductor material, i.e., p+ eSiGe. The active portion 18b of the segmented H body gate structures 18 include a gate dielectric material 30 composed of, e.g., high-k dielectric material. The high-k dielectric material can be, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The segmented H body gate structures 18 can also include sidewall spacers 32, e.g., nitride, formed by a conventional deposition process (e.g., CVD) followed by an anisotropic etching process. The sidewall spacers 32 will isolate the gate structure from the source and drain regions 28 (shown in FIG. 67). A silicide can also be provided on the raised source and drain regions 28 and segmented H body gate structures 18, prior to contact formation.

As further shown in FIG. 7B, in each of the embodiments described herein, the segmented H body gate structures 18 includes raised source and drain regions 28 adjacent to the active portion 18b. In embodiments, the raised source and drain regions 28 can be fabricated by a doped epitaxial process as is known in the art in the collector region 16a and the emitter region 16b.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    an emitter region;
    a collector region;
    base regions on opposing sides of the emitter region and the collector region; and
    a gate structure composed of a body region and leg regions, the body region being located between the base regions on opposing sides of the emitter region and the collector region, and the leg regions isolating the base regions from both the emitter region and the collector region and
    wherein the base regions are extrinsic base regions, the body region of the gate structure is over an intrinsic base region between the collector region and the emitter region, and further comprising epitaxial material in the extrinsic base regions between the leg regions.

2. The structure of claim 1, wherein the body region of the gate structure is an active gate portion over the intrinsic base region located between the emitter region and the collector region.

3. The structure of claim 1, wherein the leg regions are structured and located to prevent leakage between: a first base region and the emitter region; the first base region and the collector region; a second base region and the emitter region; and the second base region and the collector region.

4. The structure of claim 1, wherein the leg regions are structured and located to reduce base resistance in the base regions.

5. The structure of claim 1, wherein the leg regions and the body region are shaped as a segmented H body gate structure.

6. The structure of claim 5, wherein the body region and the leg regions are composed of poly silicon.

7. The structure of claim 6, wherein the leg regions are provided over an opening in a substrate, adjacent to both the emitter region and the collector region.

8. The structure of claim 1, wherein the emitter region, the collector region, and the base regions are formed on semiconductor on insulator (SOI) technology.

9. The structure of claim 1, wherein the gate structure is an H-shaped gate structure.

10. The structure of claim 1, wherein the emitter region, the collector region, and the base regions are formed on fully depleted semiconductor on insulator (SOI) technology.

11. A structure, comprising:
    a semiconductor material composed of an emitter region, a collector region and at least one base region; and
    a segmented gate structure comprising isolation regions, positioned between the at least one base region and both the emitter region and the collector region, and
    wherein the at least one base region is a first extrinsic base region on one end and a second extrinsic base region on another end, the first extrinsic base region is isolated from both the emitter region and the collector region by first and second isolation regions on the one end, and the second extrinsic base region is isolated from both the emitter region and the collector region by third and fourth isolation regions on the another end.

12. The structure of claim 11, wherein the segmented gate structure includes an active body region over an intrinsic base region between the emitter region and the collector region, and the isolation regions are leg portions extending from the active body region and which isolate the at least one base region from both the emitter region and the collector region.

13. The structure of claim 12, wherein the leg portions and the active body region are a segmented H shape body gate structure.

14. The structure of claim 11, wherein the segmented gate structure is composed of polysilicon over a fully depleted substrate.

15. The structure of claim 11, wherein the segmented gate structure is composed of polysilicon over a silicon on insulator (SOI) technology.

16. The structure of claim 15, further comprising an epitaxial material at least partly under an active body region of the segmented gate structure.

17. The structure of claim 11, further comprising semiconductor material over the emitter region and partly over an intrinsic base and under an active body portion of the segmented gate structure.

18. The structure of claim 17, wherein the active body portion is over the intrinsic base.

19. A structure comprising:
a transistor formed on semiconductor on insulator (SOI) technology and composed of:
   an emitter region,
   a collector region,
   extrinsic base regions on opposing sides of the emitter region and the collector region; and
   an active body portion of a gate structure composed of polysilicon material and extending between the extrinsic base regions; and
   isolation regions extending from the active body portion of the gate structure, the isolation regions positioned to isolate the extrinsic base regions from both the emitter region and the collector region,
   wherein the active body portion of the gate structure is over an intrinsic base region between the collector region and the emitter region, and further comprising epitaxial material in the extrinsic base regions between the isolation regions of the gate structure.

\* \* \* \* \*